United States Patent [19]

Shigaki et al.

[11] 3,908,181

[45] Sept. 23, 1975

[54] PREDICTIVE CONVERSION BETWEEN SELF-CORRELATED ANALOG SIGNAL AND CORRESPONDING DIGITAL SIGNAL ACCORDING TO DIGITAL COMPANDED DELTA MODULATION

[75] Inventors: Seiichiro Shigaki; Hiroshi Iijima; Haruo Kaneko, all of Tokyo, Japan

[73] Assignee: Nippon Electric Company Limited, Tokyo, Japan

[22] Filed: Aug. 29, 1974

[21] Appl. No.: 501,572

Related U.S. Application Data

[63] Continuation of Ser. No. 357,053, May 3, 1973, abandoned.

[30] Foreign Application Priority Data

July 17, 1972 Japan .............................. 47-71941

[52] U.S. Cl..... 340/347 AD; 340/347 DA; 325/38 B

[51] Int. Cl.$^2$ ........................................ H03K 13/22

[58] Field of Search ....... 325/38 B, 38 R; 332/11 D; 340/347 DA, 347 AD

[56] References Cited

UNITED STATES PATENTS

| | | | |
|---|---|---|---|
| 3,026,375 | 3/1962 | Graham | 325/38 B |
| 3,550,004 | 12/1970 | Candy | 325/38 B |
| 3,609,552 | 9/1971 | Limb | 325/38 B |
| 3,621,396 | 11/1971 | Daugherty | 325/38 B |
| 3,628,148 | 12/1971 | Brolin | 325/38 B |

*Primary Examiner*—Charles D. Miller
*Attorney, Agent, or Firm*—Sughrue, Rothwell, Mion, Zinn & Macpeak

[57] ABSTRACT

A predictive analog-to-digital converter for converting a self-correlated analog signal into a delta modulated digital signal according to companded delta modulation comprises a digital step size signal generator responsive to the digital signal for producing a digital step size signal variable to represent at least three step sizes for successive quantization of the self-correlated analog signal, a memory for memorizing a digital sum signal supplied thereto and for producing the memorized digital signal, an adder for deriving the algebraic sum of the memorized digital signal and the digital step size signal to produce the digital sum signal to be newly supplied to the memory, and a local digital-to-analog converter for converting the memorized digital signal into the predicted analog signal for use in comparison with the self-correlated analog signal in accordance with the predictive conversion technique.

9 Claims, 20 Drawing Figures

PREDICTIVE CONVERSION BETWEEN SELF-CORRELATED ANALOG SIGNAL AND CORRESPONDING DIGITAL SIGNAL ACCORDING TO DIGITAL COMPANDED DELTA MODULATION

This is a continuation of application Ser. No. 357,053, filed May 3, 1973, now abandoned.

BACKGROUND OF THE INVENTION

This invention relates to application of the companded delta modulation technique and the digital communication technique to a predictive converter for converting a self-correlated analog signal, such as a television picture signal, into a digital signal or converting a digital signal representative of a self-correlated analog signal back into a reproduction of the self-correlated analog signal.

As described by J. R. O'Neal in "B. S. T. J.," Vol. 45 (1966), pages 689 through 721 (May-June), under the title of 'Predictive Quantizing System for the Transmission of Television Signals' called a DPCM (differential pulse code modulation) system, it is known that a predictive encoder is advantageous as an analog-to-digital converter for converting a self-correlated analog signal into a multibit digital signal. A predictive encoder comprises means responsive to the previous values of the digital signal produced from a self-correlated analog signal for estimating or predicting the next subsequent instantaneous value of the analog signal, means responsive to the predicted value and the actual next subsequent value of the self-correlated analog signal for converting the difference therebetween into a multibit digital value, and means for delivering the last-mentioned digital value as a new digital value of the digital signal corresponding to the said next subsequent instantaneous analog value. Among similar analog-to-digital converters, one according to companded delta modulation, such as described by R. H. Bosworth and J. C. Candy in B. S. T. J., Vol. 48 (1969), pages 1459 through 1479 (May-June), under the title of 'A Companded One-Bit Coder for Television Transmission,' is simple in construction and yet has excellent conversion characteristics. In an analog-to-digital converter according to the companded delta modulation, means responsive to the predicted value of a self-correlated analog signal and the actual next subsequent instantaneous value thereof converts the difference therebetween into a one-bit digital pulse, such as a logical "1" or "0" pulse. Means for predicting the next subsequent instantaneous value of the analog signal comprises first means responsive to the 1-bit digital pulse for producing a difference analog value representative of the companded step size (width of quantization) to be used to quantize the present instantaneous value of the analog signal and second means for deriving the sum of the difference signal and the predicted analog value to predict a next subsequent analog value by the sum of the supplied analog values. More particularly, an analog-to-digital converter according to the analog companded delta modulation technique comprises, as will become clearer as the description of the present invention proceeds, an analog signal input terminal supplied with a self-correlated analog signal, a sampling pulse input terminal supplied with a train of sampling pulses, a comparator controlled by the sampling pulses and responsive to the input analog signal and a predicted analog signal described later for comparing the instantaneous analog values of the self-correlated and the predicted analog signals at every sampling point to produce a train of one-bit pulses representative of which of the simultaneously sampled instantaneous analog values is the greater, an output terminal for deriving the 1-bit pulse train as the output delta modulated digital signal, a step size signal generator responsive to each digital value of the 1-bit pulse train for generating an analog step size signal for the successive quantization of the self-correlated analog signal, an adder for deriving the algebraic sum of the predicted analog signal and the analog step size signal to produce a newly predicted analog signal, and a memory for memorizing the newly predicted analog signal and producing the memorized analog signal as the predicted analog signal. Likewise, a digital-to-analog converter according to the analog companded delta modulation technique comprises a digital signal input terminal supplied with a delta modulated digital signal derived from a self-correlated analog signal, an analog step size signal generator of the same function as that described just above, an adder for deriving the algebraic sum of a predicted analog signal described below and the analog step size signal to produce a newly predicted analog signal to be supplied to the adder as the predicted analog signal of the next subsequent instantaneous value, and a digital-to-analog converter output terminal for deriving the newly predicted analog signal memorized and produced by the memory as the reproduction of the self-correlated analog signal. In summary, a predictive converter according to the analog companded delta modulation technique carries out the predictive conversion between a digital value of a one-bit pulse train decided with reference to an instantaneous analog value of a self-correlated analog signal sampled at each sampling point and a corresponding value of a predicted analog signal produced with reference to a step size determined in compliance with at most a predetermined number of consecutive digital values of the one-bit pulse train decided in connection with prior sampling points preceding the said each sampling point.

It should be recalled here that the companded delta modulation technique makes use of the fact that the characteristics of the visual sensation for the pictures reproduced from a picture signal render the noises appearing accompanied by rapid variation of the signal (corresponding to rapid horizontal variation of the picture brightness) more imperceptible than the noises occurring with slow variation of the signal (slow horizontal variation in the picture brightness). Based on the fact, the step size is made larger and smaller at the rapidly varying portion and the slowly varying portion (hereafter referred to as the "background" as the case may be) of the signal, respectively, to let the delta modulated digital signal follow the original analog signal as closely as possible with the smallest possible visual quantization noises. More specifically, the analog step size signal generator multiplies the previous step size by P ($1<P<2$) whenever two consecutive digital values are the same. The generator also multiplies the previous step size by $-1/Q$ ($1<Q<2$) whenever two consecutive digital values are not the same. At the rapidly varying portions of the original analog signal, a compromise is necessary between the requirement for the least possible step size for the purpose of reducing the visual quantization noises and the requirement for the sufficiently large step size for achieving an excellent simulation of the original analog signal. Usually, the largest step size is greater than the smallest one by a factor of from two to five. In addition, it is known as discussed by M. R. Winkler in "IEEE Internat. Conf. Record," Part 1, 1965, pages 285 through 290, under the title of "Pictorial Transmission with H.I.D.M.," that it is impossible to attain stable operation of the step size signal generator unless the step sizes $a_1$, $a_2$, . . . , and $a_n$ for the successive same digital values 1, 2, . . . , and $n$, respectively, of a delta modulated digital signal satisfy $a_1 + a_2 + \ldots + a_{i-1} \geqq a_i$ where $i$ is greater than two and less than $n$.

It should furthermore be recalled in connection with the PCM communication technique that the quantization noises of an electric power of $d^2/12$, where $d$ represents the smallest step size or a unit step size for quantization, are present within a noise frequency band below a half of the sampling frequency and that a half of the sampling frequency is the highest frequency of the transmission signal band. As a result, the quantization noises appear over the whole transmission band. In addition, it should be pointed out that the quantization noises do not occur uniformly within the noise frequency band but that the quantization noise spectra for the slowly varying portions of the original analog signal appear in the lower frequency region which is more perceptible to human eyes. As for the delta modulation, a half of the sampling frequency is so much higher than the highest frequency of the transmission band that only a small fraction of the quantization noise spectra appears within the transmission band. The quantization noises, however, still appreciably appear within the signal band.

As a matter of fact, the analog-to-digital converter for carrying out the conversion in accordance with the predictive analog companded delta modulation technique by summation of the successive analog values of the step size signal is undesirable in that it has been difficult to attain excellent performance thereby. This is because the noises, such as the quantization noises and the overload distortion or noises, are superimposed on the predicted analog signal. Above all, the analog step size signal generator of the analog-to-digital or the digital-to-analog converter inevitably produces an error in the analog step size signal, which error is accumulated by the summation to grow considerably large and added to the output digital or analog signal. In addition, it has been difficult with a conventional converter of the kind described to make the largest step size greater than the smallest step size by a factor exceeding two. This is because the errors in the step size would otherwise result in larger noises. Furthermore, it has been practically impossible to design an analog step size signal generator operable to successively multiply the previous step size by a factor of P for a considerably long while.

SUMMARY OF THE INVENTION

It is therefore an object of the present invention to provide such a converter for carrying out conversion between a self-correlated analog signal and a corresponding signal in accordance with the predictive conversion technique and the companded delta modulation technique, as may exhibit excellent performance.

it is another object of this invention to provide a converter of the kind described, which produces an output signal having the fewest possible errors.

It is still another object of this invention to provide a converter of the kind described, which suffers little from the quantization noises.

It is a further object of this invention to provide a converter of the kind described, with which it is easy to make the largest step size for the quantization greater than the smallest one by a factor between 2 and 5.

In accordance with this invention there is provided an analog to digital converter and a corresponding digital to analog converter, which include digital step size generators for generating a digital value representative of one of at least three step size values. The step size selected by said generator depends upon the pattern of zero and one bits of the digital signal being converted. An accumulator operates to accumulate the digital outputs from said generator and provides the accumulated value as the analog output (for the D to A converter) or as the predictive analog value (for the A to D converter). In the A to D converter the digital signal is obtained by comparing the instantaneous value of an input analog signal with the present predictive analog value. The comparisons occur at repetitive sample times and each comparison results in one bit of the digital signal. The value of the bit (0 or 1) depends upon the results of the comparison.

In accordance with this invention, there is provided a converter for carrying out predictive conversion between a digital value of a one-bit pulse train decided with reference to an instantaneous analog value of a self-correlated analog signal sampled at each sampling point, on the one hand, and a corresponding value of a predicted analog signal produced with reference to a step size determined in compliance with at most a predetermined number of consecutive digital values of said one-bit pulse train decided in connection with prior sampling points preceding said each sampling point, on the other hand, wherein the improvement comprises first means for generating, prior to a posterior sampling point succeeding each sampling point, a digital step size signal representative of the digital step size selected in connection with said each sampling point from at least three predetermined digital step sizes in compliance with at most said predetermined number of consecutive digital values of said one-bit pulse train including the digital value decided in connection with said each sampling point, second means for accumulating therein prior to said posterior sampling point an accumulation digital signal with reference to a digital algebraic sum of at least a portion of the accumulated digital signal accumulated therein prior to said each sampling point and said digital step size selected in compliance with said each sampling point, and third means responsive to the accumulation digital signal accumulated in said second means prior to said each sampling point for producing said corresponding value of said predicted analog signal.

The digital communication technique resorted to in accordance with this invention introduces no error into the digital step size signal in principle. The summation or accumulation carried out for the successive digital values of the step size signal removes the difficulty in making the largest step size greater than the smallest one by a factor exceeding two. Other features of this invention will become clear as the description thereof proceeds.

Figure 1:
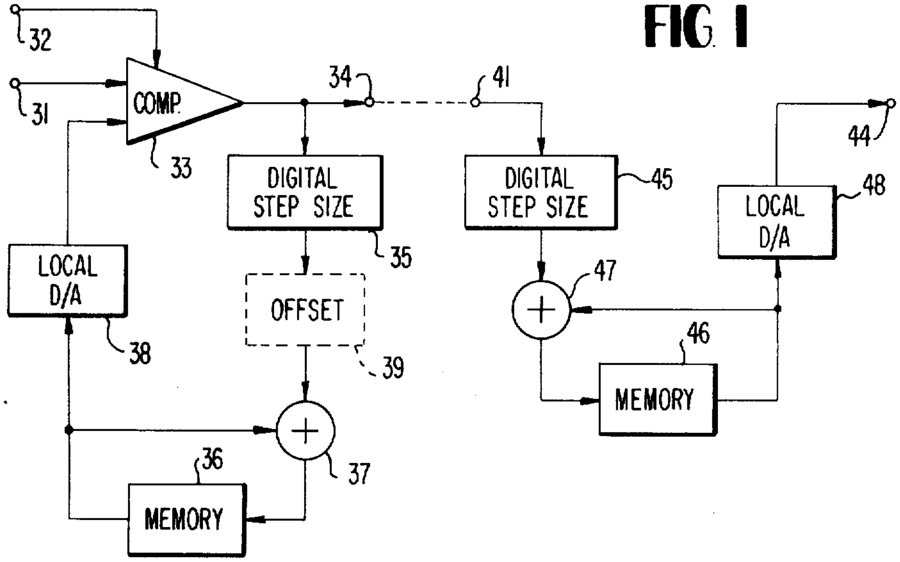
FIG. 1 shows a block diagram of an analog-to-digital and a digital-to-analog converter according to a first embodiment of the instant invention, together with an analog-to-digital converter according to a modification of the first embodiment.

DESCRIPTION OF THE PREFERRED EMBODIMENTS:

Referring to FIG. 1, an analog-to-digital converter for converting a self-correlated analog signal, such as a television picture signal, into a delta modulated digital signal according to a first embodiment of the present invention comprises an analog signal input terminals 31 supplies with the self-correlated analog signal, a sampling pulse input terminal 32 supplied with a train of sampling pulses, a comparator 33 controlled by the sampling pulses and responsive to the self-correlated analog signal and a predicted analog signal described later for comparing the instantaneous analog values of the self-correlated analog signal and the predicted analog signal at every sampling point to produce a train of 1-bit pulses, such as logic 1 and 0 pulses, each being representative of which of the simultaneously sampled instantaneous analog values is the larger, a converter output terminal 34 for deriving the 1-bit pulse train as the delta modulated digital signal, a digital step size signal generator 35 responsive to each digital value of the pulse train for generating a digital step size signal variable to represent at least three predetermined digital step sizes for successive quantization of the self-correlated analog signal, a memory 36 for accumulating therein or memorizing an accumulation signal supplied thereto and for producing an accumulated digital signal, an adder 37 for deriving a digital algebraic sum of the accumulated digital signal and the digital step size signal to produce a digital sum signal to be supplied to the memory 36 as the accumulation signal, and a local digital-to-analog converter 38 for converting the accumulated digital signal into a local analog signal to be supplied to the comparator 33 as the predicted analog signal. In accordance with a modification of the first embodiment, the converter may comprise an offset circuit 39 for offsetting the digital step size in the manner to be described hereunder.

Further referring to FIG. 1, a digital-to-analog converter according to the first embodiment comprises a digital signal input terminal 41 supplied with a delta-modulated digital signal from an analog-to-digital converter according to the first embodiment through a transmission line depicted with a dashed line, an analog signal output terminal 44 for deriving an output analog signal reproduced from the delta modulated digital signal, a digital step size signal generator 45 responsive to each digital value of the digital signal for generating a digital step size signal variable to represent the step sizes used in the participant analog-to-digital converter, a memory 46 for accumulating therein an accumulation signal supplied thereto and for producing an accumulated digital signal, an adder 47 for deriving a digital algebraic sum of the accumulated digital signal and the digital step size signal to produce a digital sum signal to be supplied to the memory 46 as the accumulation signal, and a local digital-to-analog converter 48 for converting the accumulated digital signal into an analog signal to be supplied to the analog signal output terminal 44.

Figure 2:
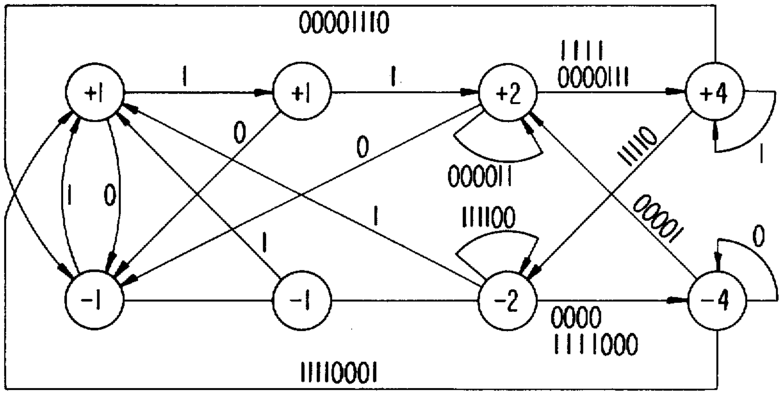
FIG. 2 illustrates a step size variation scheme adopted to a converter according to this invention.
Figure 3:
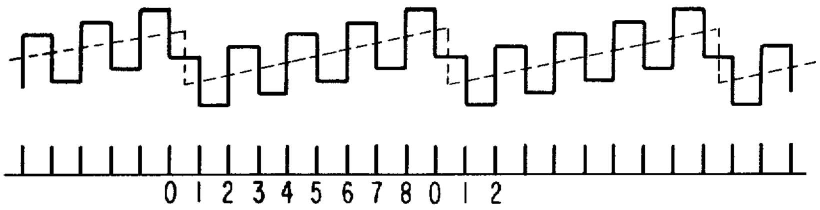
FIG. 3 shows a wave form obtained with the modified analog-to-digital converter depicted in FIG. 1.

Referring to FIG. 2, an example of the step size variation scheme for use in a case where the digital values 1 and 0 represent that the self-correlated analog signal is greater and less than the predicted analog signal, respectively, is proposed herein based on the H.I.D.M. system of the Winkler reference mentioned above wherein the factors P and Q are both 2. The scheme is such that the step size is digitally varied among a minimum step size ±1, a medium step size ±2, and a maximum step size ±4 (relative step size) in the manner illustrated by arrows in response to the digital values of the delta modulated signal denoted along the arrows. More particularly, let it be assumed that the 1-bit pulse train supplied to the digital step size signal generator 35 or 45 at a sampling point No. 0 assumes, by way of example, a logic 1 value. FIG. 2 shows that the digital step size signal generator 35 or 45 then produces a digital step size signal representative of one of the three predetermined digital step sizes that is selected in compliance with consecutive digital values of the 1-bit pulse train at prior sampling points No. −1, No. −2, . . . , and No. −6 in the manner given in Table below. The circuitry of a digital step size signal generator 35 or 45 operable to put the proposed scheme into effect will be illustrated later with reference to FIG. 11. Incidentally, the scheme satisfies the condition cited hereinabove from the Winkler reference and avoids the infinitely repeated multiplication of the previous step size by the factor P.

quency region to remarkably reduce the visual background noises. Reduction of the difference between the positive and the negative going minimum step size renders the residual low frequeny quantization noises smaller. This, however, lowers the frequency of the offset wave. It is therefore desirable to choose the difference so that both the quantization noises and the residual low frequency noises are sufficiently small. In view of the fact that the peak to peak value of the residual low frequency noises is usually made less than 1 percent of the amplitude of the picture signal as described in the O'Neal reference mentioned above, it is preferred to select the minimum step size in a region between 2 to 5 percent of the picture signal amplitude. Incidentally, the frequency of the offset wave exemplified in FIG. 3 is about 670 kHz in case the sampling frequency is 6 MHz and falls inside of the picture signal band of 1 MHz. Even the frequency of the offset wave may be as low as two-thirds of the highest picture signal Table

| Digital Values at Sampling Points: | | | | | | | Digital |
|---|---|---|---|---|---|---|---|
| No. −6 | No. −5 | No. −4 | No. −3 | No. −2 | No. −1 | No. 0 | Step Size |
| x | x | x | 1 | 1 | 1 | 1 | +4 |
| 0 | 0 | 0 | 0 | 1 | 1 | 1 | +4 |
| x | x | x | 0 | 1 | 1 | 1 | +2 |
| x | 0 | 0 | 0 | 0 | 1 | 1 | +2 |
| x | x | 0 | 0 | 0 | 0 | 1 | +2 |
| | | others | | | | 1 | +1 |

Referring to FIG. 3, short vertical lines shown side by side in the lower half of the drawing illustrates the sampling pulses. It is now assumed that the self-correlated analog signal varies with a step sufficiently smaller than a unit step size or the absolute value of the minimum step size in each sampling period. Such is the case with the analog signal representative of the background of a picture. It shall now be called "to offset" to render either the positive or the negative going minimum step size 1 or −1 different from the unit step size by $1/(2^m)$ of the unit step size, where m represents a predetermined positive integer. When 5/4 and −1 are selected as the positive and the negative going minimum step sizes, respectively, it has now been found possible to make the equivalent quantization noises for the background equal to the quantization noises determined by the difference between 5/4 and $|-1|$ rather than by those dependent either on 5/4 or $|-1|$ and thus to reduce the whole visually perceptible noises. More particularly, the predicted analog signal for a very slowly varying analog signal or a direct current analog signal repeats two successive excursions of ±1 in total with a definite period of nine sampling periods (nine being the lest integral sum of 5/4 and $|-1|$) in the manner illustrated with a solid line to make the mean value called herein the "offset wave" undulate with the same definite period as shown by a broken line and follow the self-correlated analog signal. In the manner mentioned in the preamble of the instant specification, the quantization noises of an electric power of $d^2/12$ are present also in the offset delta modulated digital signal. The offset procedure, however, shifts the quantization noise spectra for the background to the adjacency of the frequency of the offset wave. By choosing the frequency of the offset wave at the outside of the signal band, it is thus possible to shift the quantization noise spectra from the lower frequency region to the higher frefrequency to fall within the picture signal band, the residual visually perceptible noises are less than 15 d of the low frequency noises. The offset circuit 39 for putting the offset operation into effect will be illustrated later with reference to FIG. 14.

Figure 4:
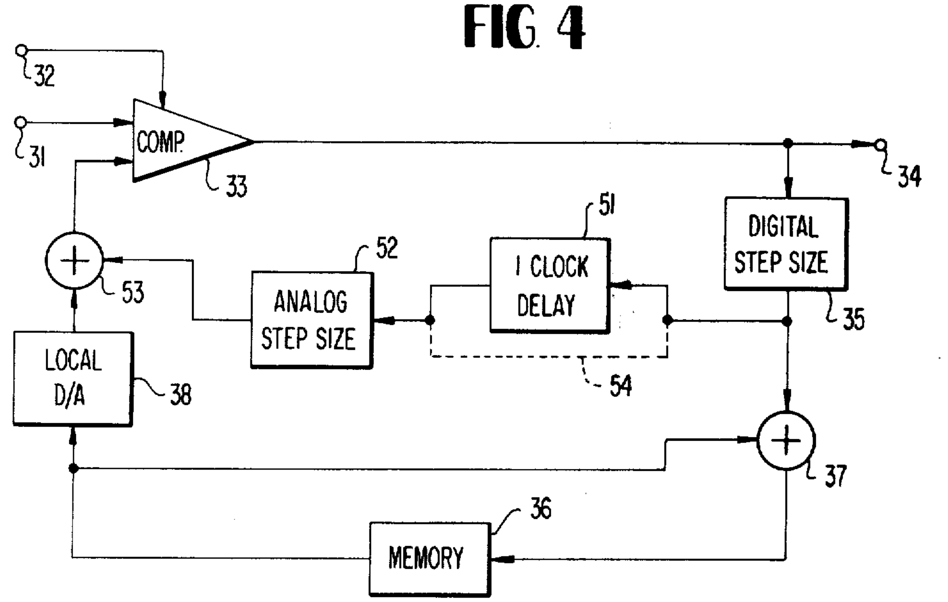
FIG. 4 shows a block diagram of an analog-to-digital converter according to a second embodiment of this invention, together with a modification of the second embodiment.

Referring now to FIG. 4, an analog-to-digital converter for converting a self-correlated analog signal into a delta modulated digital signal according to a second embodiment of this invention comprises an analog signal input terminal 31, a sampling pulse input terminal 32, a comparator 33, a digital signal output terminal 34, a digital step size signal generator 35, a memory 36, an adder 37, and a local digital-to-analog converter 38, all similar tho the corresponding units illustrated with reference to FIG. 1. The converter further comprises a delay circuit 51 for delaying the digital step size signal by one sampling period, an analog step size signal generator 52, such as used in a conventional predictive analog-to-digital converter according to the analog companded delta modulation technique, responsive to the delayed digital step size signal supplied thereto as a local digital signal for generating an analog step size signal, and an analog adder 53 for deriving the analog abgebraic sum of the analog signal converted from the accumulated digital signal, or a local analog signal as herein named, and the analog step size signal to produce the predicted analog signal. Despite the excellent reduction capability of the visually perceptible noises for a very slowly varying analog signal, the offset delta modulation technique loses the noise reduction capability as the variation of the self-correlated analog signal becomes more rapid, augments the low frequency noises when the analog signal varies with a slope that is equal to the slope of the serrasoidally undulating offset wave, and exhibits large errors in case the analog signal has a slope of the polarity opposite to the slope of the offset wave together with the undesirable addition of approximately flat noise spectra. In contrast, the second embodiment is capable of reducing the visual noises by resorting not to the offset procedure but to addition of a delayed step size signal whereby the minimum step size is reduced in effect to about a half for a self-correlated analog signal of whichever slope that will not be so large as will result in the overload of the step size signal generator 35.

Figure 5:
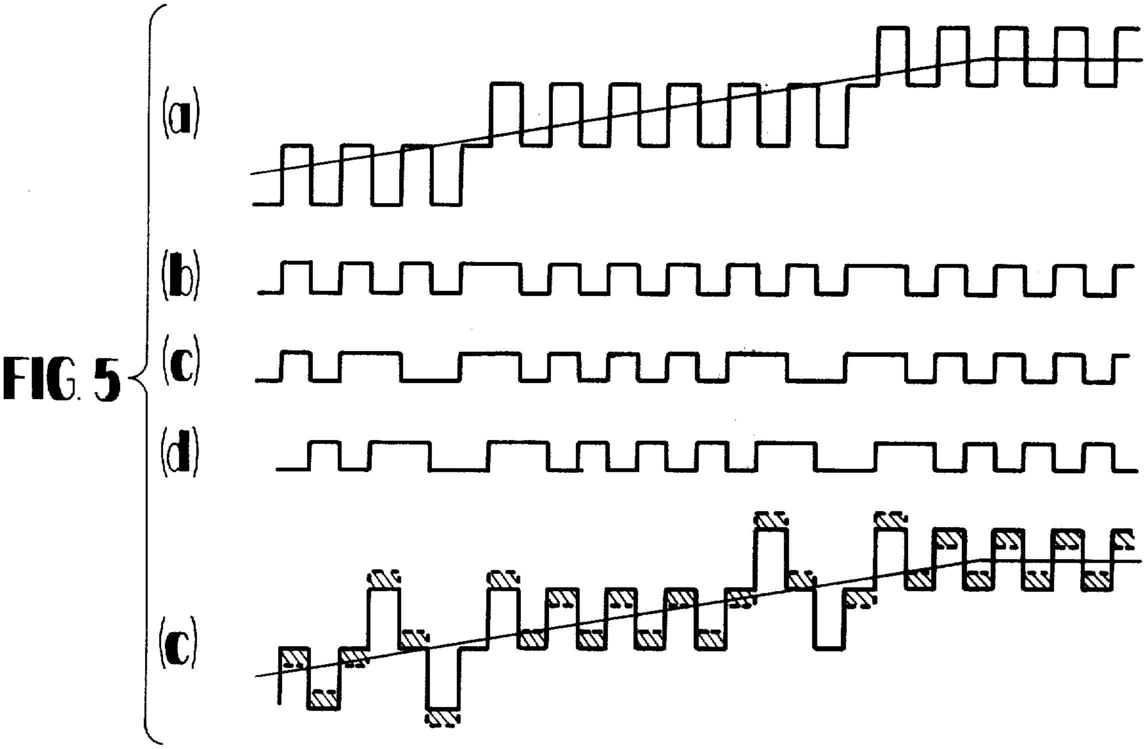
FIG. 5 illustrates wave forms of the signals appearing at various points in the converter depicted in FIG. 4.

Referring to FIG. 5, (*a*) shows an input analog signal and the predicted analog signal derived without the addition of the analog step size signal with a thin sloping line and a thick stepwise solid line, respectively, (*b*) illustrates the corresponding delta modulated digital signal, and (*c*) and (d) show the delta modulated digital signal derivable from an analog-to-digital converter according to the second embodiment and the analog step size signal, respectively. In FIG. 5 (*e*), the signals obtained with addition of the analog step size signal are depicted. The stepwise solid line shows the local analog signal, while the hatched areas shown between the stepwise line and short dashed lines illustrate the analog step size signal algebraically added to the local analog signal to derive the predicted analog signal depicted with the short dashed lines. It is now understood that the addition of the analog step size signal is equivalent to removal of a fraction of the step size during each of those sampling periods in which the input analog signal is generally greater than the local analog signal and subsequent addition of the removed fraction to the local analog signal during each of those sampling periods in which the input analog signal is less than the local analog signal in general and that the quantization noises appearing within the signal band are reduced to about a quarter.

Referring back to FIG. 4, an analog-to-digital converter according to the second embodiment may be provided further with a signal path 54 between the digital step size signal generator 35 and the analog step size signal generator 52 to supply both the instantaneous and the delayed digital step size signals to the analog step size signal generator 52 as the local digital signal. Besides the delayed addition, this provides instantaneous addition of the analog step size signal derived directly from the digital step size signal to the local analog signal and adapts the converter to a higher speed operation. More specifically, it will readily be appreciated that the smallest possible sampling period depends on the time required between comparison of the input and the predicted analog signals effected by the comparator 33 in response to a sampling pulse and production of the next subsequent instantaneous analog value of the predicted analog signal and that the delay provided by the analog step size signal generator 52 and the analog adder 53 of the instantaneous analog summation loop is much shorter than the delay provided by the digital adder 37, the memory 36, and the local digital-to-analog converter 38.

Figure 6:
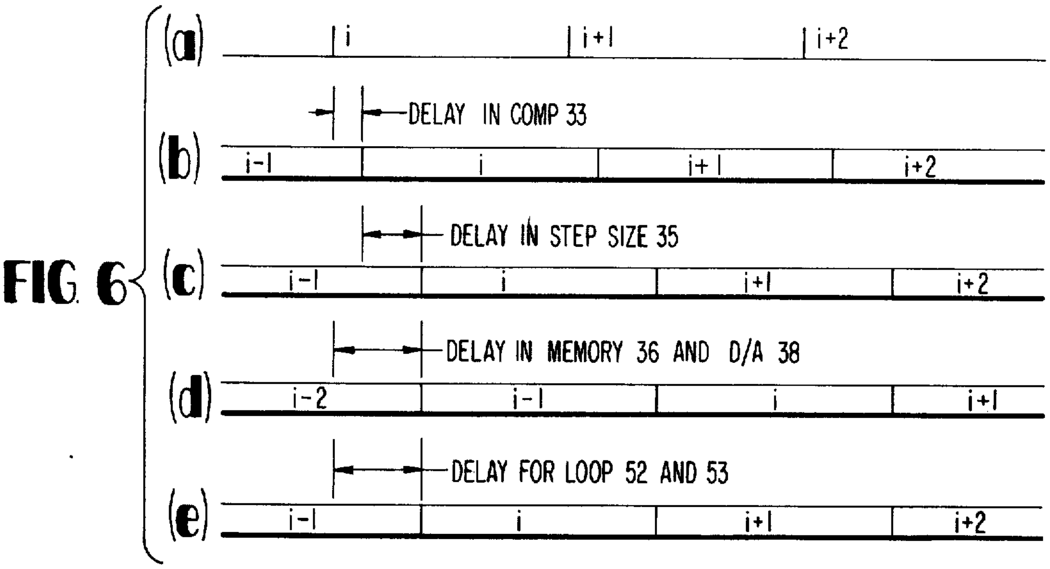
FIG. 6 is a time chart for explaining the operation of an analog-to-digital converter according to the modification of the second embodiment.

FIGS. 6 (*a*), (*b*), (*c*), (*d*), and (*e*) give the time charts of the $i$-th, the $(i + 1)$-th, and the $(i + 2)$-th sampling pulses, the $(i - 1)$-th, the i-th, the $(i + 1)$-th, and the $(i + 2)$-th 1-bit pulses produced by the comparator 33, the digital values of the digital step size signal derived by the digital step size signal generator 35 from these 1-bit pulses, the instantaneous values of the local analog signal, and the instantaneous value of the predicted analog signal given from the analog adder 53, respectively.

Figure 7:
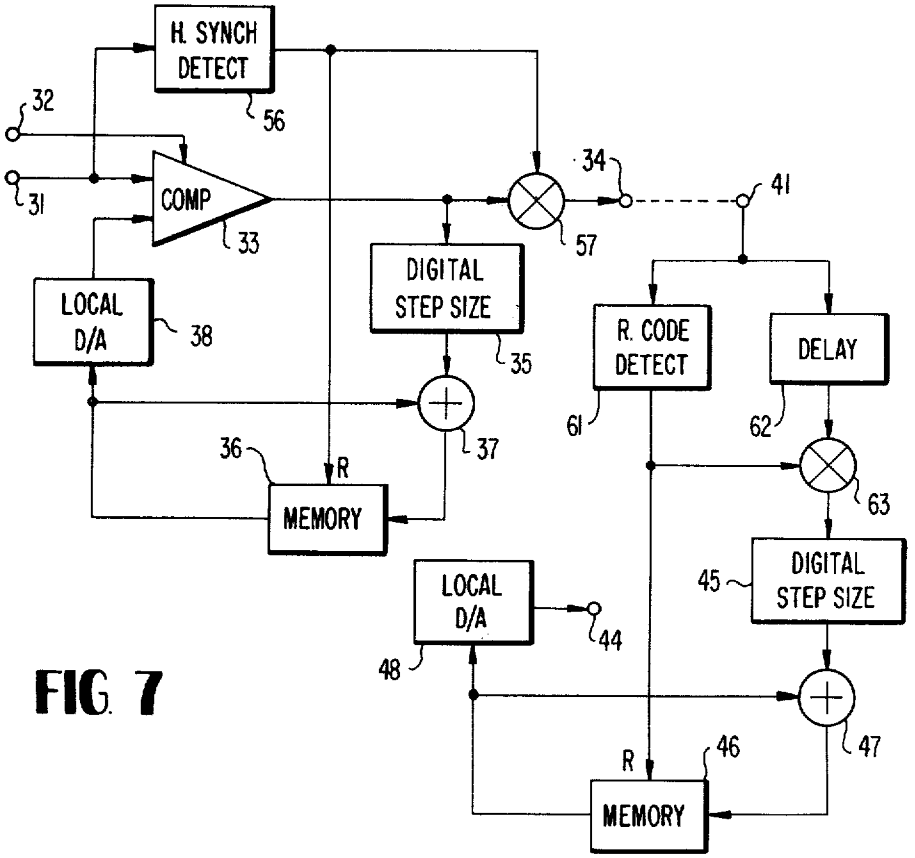
FIG. 7 is a block diagram of an analog-to-digital and a digital-to-analog converter according to a third embodiment of this invention.

Referring to FIG. 7, an analog-to-digital converter according to a third embodiment of this invention specifically adapted to transmission of such a self-correlated analog signal, such as the picture signals, as may substantially periodically assume a combination of predetermined analog values comprises an analog signal input terminal 31, a sampling pulse input terminal 32, a comparator 33, a digital signal output terminal 34, a digital step size signal generator 35, a memory 36, an adder 37, and a local digital-to-analog converter 38, all similar to the corresponding units illustrated with reference to FIGS. 1 and 4 except that the memory 36 is provided with a reset terminal R. The converter further comprises a predetermined analog value detector 56, such as a horizontal synchronizing signal detector, for detecting each combination of the predetermined analog values to produce a detection signal which is supplied to the reset terminal R of the memory 36 as a reset signal to reset the contents of the memory 36 to a prescribed digital value, such as representative of the level of the horizontal synchronizing signal, and a specific code substitution circuit 57 interposed between the comparator 33 and the converter output terminal 34 and responsive to the detection signal for substituting a specific code which may be called a reset code, such as a continuation of digital values of logic 0 ending at a digital value of logic 1, for the delta modulated digital signal produced in response to each combination of the predetermined analog values. In compliance with the construction mentioned above, a digital-to-analog converter according to the third embodiment for use in decoding a delta modulated digital signal substantially periodically interspersed with a reset code, or a combination of predetermined digital values, comprises a digital signal input terminal 41, an analog signal output terminal 44, a digital step size signal generator 45, a memory 46, an adder 47, and a local digital-to-analog converter 48, all similar to the corresponding units of the analog-to-digital converter according to the third embodiment. The digital-to-analog converter further comprises a predetermined digital value detector or a reset code detector 61 responsive to each of the reset codes for producing a detection signal to be supplied to the reset terminal R of the memory 46 to reset the contents of the memory 46 to a prescribed digital value, a delay circuit 62 for delaying the input digital signal by a delay equal to the duration of each of the reset codes, and a specific code substitution circuit 63 interposed between the delay circuit 62 and the digital step size signal generator 45 and responsive to the detection signal for substituting a specific code, such as a stationary signal code "101010 . . . 10" representative of stationary analog values, for each of the reset codes interspersed in the delayed input digital signal. The units 56, 57, and 61 through 63 specific to the third embodiments will later be described with reference to FIGS. 16 and 17.

Referring again to FIGS. 1, 4, and 7, it is to be reminded that the delta modulated digital signal produced by an analog-to-digital converter in general represents only the variation of the input self-correlated analog signal, or more precisely, the predicted analog signal. Should an error of even a single bit occur in the digital signal transmitted from an analog-to-digital converter of the kind described to an associated digital-to-analog converter, such as mistransmission of a false logic 0 pulse in place of a correct logic 1 pulse, the contents of the memory 46 of the digital-to-analog converter becomes different from the contents of the participant memory 36 to misproduce the analog signal at the analog signal output terminal 41. With a memory 46 of the digital-to-analog converter of a finite capacity, the error will lead to a lack of a portion of the reproduced analog signal or cause a large distortion to the output analog signal. The third embodiment illustrated with reference to FIG. 7 is devoid of this kind of misoperation. In principle, it is possible to obviate misoperation either by resetting the memories 36 and 46 to a predetermined digital value at those corresponding sampling points for the signals being dealt with which little affect the signal transmission or by providing a leak path to each of the memories 36 and 45 for reducing the contents thereof at a preselected rate. The resetting is resorted to in the third embodiment, for example, at the horizontal synchronizing periods. The reset code of "000000 . . . 01" is selected because such will never appear as the digital values representative of a picture. The stationary signal code of 101010 . . . 10 is employed with a view to reducing the noises in the memorized digital signal produced from the memory 46. It is now understood that the third embodiment is applicable to a selfcorrelated analog signal interspersed with signal portions that are detectable on the transmitting side and easily reproducible at the receiving end, with additional requirements such that either the signal portions are spaced apart by such short intervals as may not cause the noises produced by the error to intolerably grow in the memorized digital signal or the analog signal is not materially affected by superposition of noises of a certain extent on those parts of the delta modulated digital signal which correspond to the analog signal portions.

Figure 8:
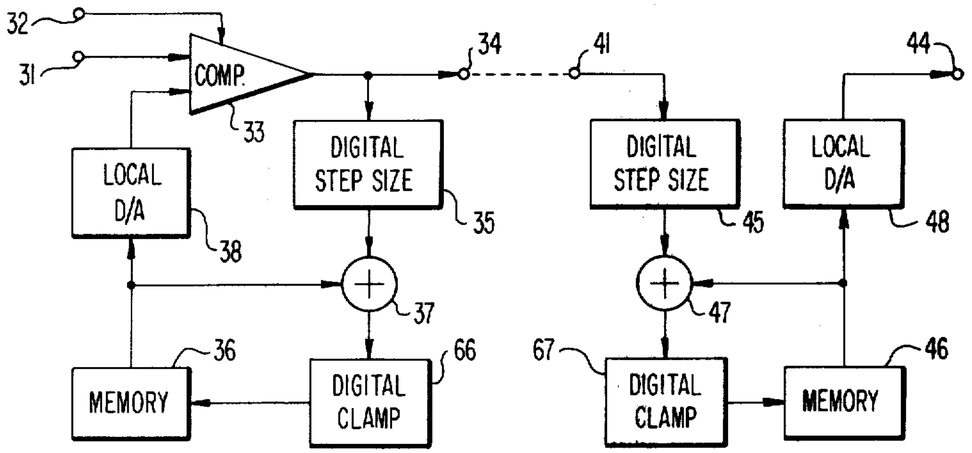
FIG. 8 is a block diagram of an analog-to-digital and a digital-to-analog converter according to a fourth embodiment of this invention.

Referring to FIG. 8, an analog-to-digital converter according to a fourth embodiment of this invention comprises an analog signal input terminal 31, a sampling pulse input terminal 32, a comparator 33, a digital signal output terminal 34, a digital step size signal generator 35, a memory 36, an adder 37, and a local digital-to-analog converter 38, all similar to the corresponding units illustrated with reference to FIGS. 1 and 4. The converter further comprises a digital limiter or clampler 66 for limiting the digital sum signal to be supplied to the memory 36 to a level that is equal to or less than the maximum capacity of the memory 36 minus the maximum step size. The digital limiter 66 may further limit the digital sum signal to a level that is equal to or greater than the minimum capacity of the memory 36 plus the maximum step size. This prevents the digital sum signal from exceeding the maximum or the minimum capacity of the memory 36 even when the maximum step size is added to or subtracted from the accumulated digital signal at the next subsequent sampling point. Likewise, a digital-to-analog converter according to the fourth embodiment comprises a digital signal input terminal 41, an analog signal output terminal 44, a digital step size signal generator 45, a memory 46, an adder 47, and a local digital-to-analog converter 48, all similar to the corresponding units described in connection with the first and the second embodiments. The digital-to-analog converter further comprises a digital limiter or clamper 67 that is similar to the limiter 66 mentioned above. The limiters 66 and 67 will be described later in more detail with reference to FIGS. 18 and 19.

Further referring to FIG. 8, the fourth embodiment is capable of avoiding the misoperation introduced by an error in the digital value or values of the delta modulated digital signal during transmission. In principle, the misoperation is avoided by providing the memory 46 of the digital-to-analog converter with a clamper capability, which makes it possible to deal the digital sum signal exceeding the maximum or the minimum capacity of the memory 46 as an input signal of the maximum or the minimum capacity. This will cause the direct current level to be inevitably shifted by the error of the digital value or values but is practical for transmission of general self-correlated alternating current analog signals. The limiter 66 of the analog-to-digital converter operates as a clipper for determining the maximum and the minimum levels of the input analog signal to make it possible to use a memory 46 of a least feasible capacity. The limiters 66 and 67, however, increases the delay of operation.

Figure 9:
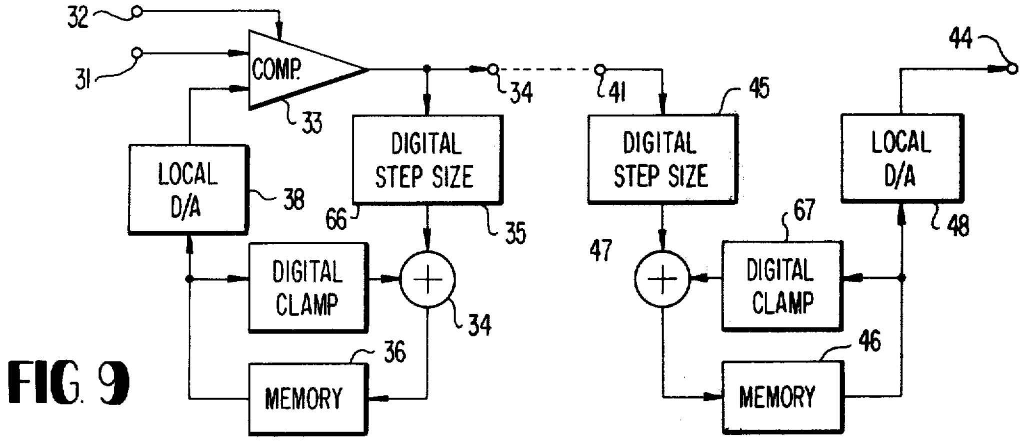
FIG. 9 is a block diagram of an analog-to-digital and a digital-to-analog converter according to a fifth embodiment of this invention.

Referring to FIG. 9, an analog-to-digital and a digital-to-analog converter according to a fifth embodiment of this invention are of the like construction as the corresponding converters according to the fourth embodiment except that the digital limiters 66 and 67 are placed in shunt with the memories 36 and 46, respectively. This obviates the increase in the delay.

Figure 10:
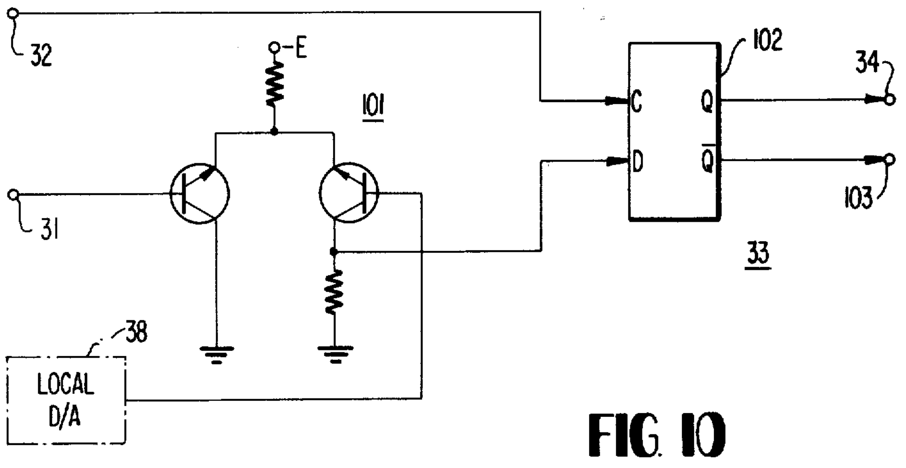
FIG. 10 shows an example of the comparators used throughout the embodiments of this invention.

Referring to FIG. 10, an example of the comparators 33 used throughout the embodiments comprises a differential amplifier 101 supplied with the self-correlated analog signal through the analog signal input terminal 31 and the predected analog signal either from the local digital-to-analog converter 38 in the manner illustrated in FIG. 10 or from the anlog adder 53 illustrated with reference to FIG. 4 for producing a difference signal of either polarity representative of which of the supplied analog signals is the greater and a flip-flop circuit 102 supplied with the sampling pulses through the sampling pulse input terminal 32 at the C input terminal and the difference signal from the differential amplifier 101 at the D input terminal for memorizing the polarity of the difference signal and delivering the one-bit pulse train from the Q output terminal to the converter output terminal 34 and a complementary or NOT output pulse train from the $\overline{Q}$ output terminal to a comparator output terminal 103.

Figure 11:
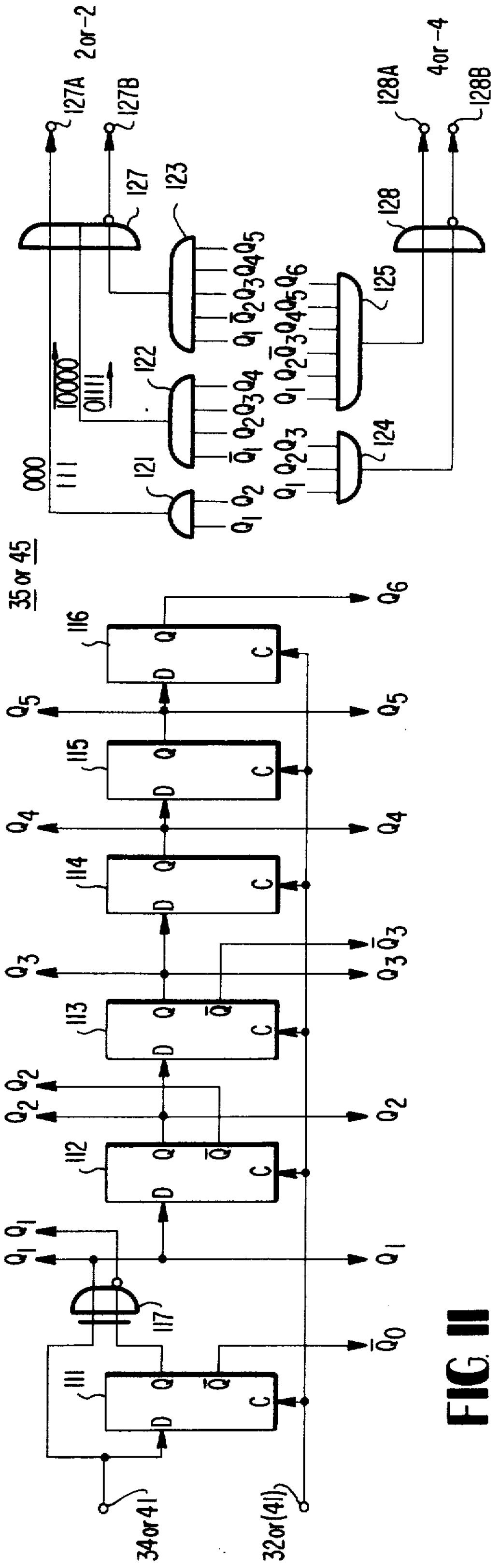
FIG. 11 is a block diagram of an example of the digital step size signal generators used in the embodiments of this invention.

Referring to FIG. 11, an example of the digital step size signal generators 35 and 45 used in the embodiments comprises a shift register which in turn comprises a first through a sixth flip-flop circuit 111, 112, 113, 114, 115, and 116 and an exclusive OR circuit 117. The C input terminals of the flip-flop circuits 111 through 116 are supplied with the sampling pulses either through the sampling pulse input terminal 32 or from a clock pulse regenenerator (not shown) for regenenating the sampling pulses in the known manner from the delta modulated digital signal supplied thereto through the digital signal input terminal 41. The D input terminals of the first flip-flop circuit 111 and one of the two input terminals of the exclusive OR circuit 117 are supplied with the true one-bit pulse train either from the converter output terminal 34 or from the digital signal input terminal 41. The first flip-flop circuit 111 applies its true output signal from the Q output terminal to the other of the input terminals of the exclusive OR circuit 117. The exclusive OR circuit 117 and the second through the fifth flip-flop circuits 112 through 115 supply their true output signals to the D input terminals of the second through the sixth flip-flop circuits 112 through 116, respectively. The true output signal of the exclusive OR circuit 117 supplied to the D input terminal of the second flip-flop circuit 112 becomes logic 1 and 0 when the two consecutive pulses of the delta modulated digital signal are of the same digital value and of the different digital values, respectively. The digital step size generator 35 or 45 further comprises a first through a fifth AND gate 121, 122, 123, 124, and 125 and a first and a second OR gate 127 and 128. Supplied with the true output signals of the exclusive OR circuit 117 and the second flip-flop circuit 112, the first AND gate 121 produces a logic 1 output pulse when the three consecutive pulses of the delta modulated digital signal are either "000" or "111." Supplied with the NOT output signal of the exclusive OR circuit 117 and the true output signal of the second through the fourth flip-flop circuits 112 through 114, the second AND gate 122 produces a logic 1 output pulse when the five consecutive pulses of the delta modulated digital signal are either "00001" or "11110." Supplied with the true output signal of the exclusive OR circuit 117, the NOT output signal of the second flip-flop circuit 112, and the true output signals of the third through the fifth flip-flop circuits 113 through 115, the third AND gate 123 produces a logic 1 output pulse when the six consecutive pulses of the delta modulated digital signal are either "000011" or "111100." Responsive to the output pulses of the first through the third AND gates 121 through 123, the first OR gate 127 delivers a logic 1 and a logic 0 output pulse to a true and a NOR first output terminal 127A and 127B, respectively, when the delta modulated digital signal comprises a succession of digital values 000, 00001, 000011, 111, 11110, or 111100. As will soon become clear, these output pulses serve as a digital step size pulse representative of the medium step size 2 or −2. Supplied with the true output signals of the exclusive OR circuit 117 and the second and the third flip-flop circuits 112 and 113, the fourth AND gate 124 produces a logic 1 output pulse when the four consecutive pulses of the delta modulated digital signal are either 0000 or 1111. Supplied with the true output signals of the exclusive OR circuit 117 and the second flip-flop circuit 112, the NOT output signal of the third flip-flop circuit 113, and the true output signals of the fourth through the sixth flip-flop circuits 114 through 116, the fifth AND gate 125 produces a logic 1 output pulse when the seven consecutive pulses of the delta modulated digital signal are either 0000111 or 1111000. Responsive to the output pulses of the fourth and the fifth AND gates 124 and 125, the second OR gate 128 delivers a logic 1 and a logic 0 output pulse to a true and a NOR second output terminal 128A and 128B, respectively, when the delta modulated digital signal comprises a succession of digital values 0000, 0000111, 1111, or 1111000. These output pulses are used in the following as a digital step size pulse representative of the maximum step size 4 or −4. With this example of the digital step size signal gerenators 35 and 45, the first OR gate 127 produces the logic 1 and 0 pulses whenever the second OR gate 128 produces the logic 1 and 0 pulses, respectively. This example serves well when an accumulator of the reversible counter type is used for a combination of the memory 36 and the adder 37. In case a register and an adder are separately used as the memory 36 and the adder 37, it is necessary that two inhibit circuits (not shown) responsive to the digital step size pulses derived from the second output terminals 128A and 128B be employed to inhibit the digital step size pulses derived from the first output terminals 127A and 127B, respectively.

Figure 12:
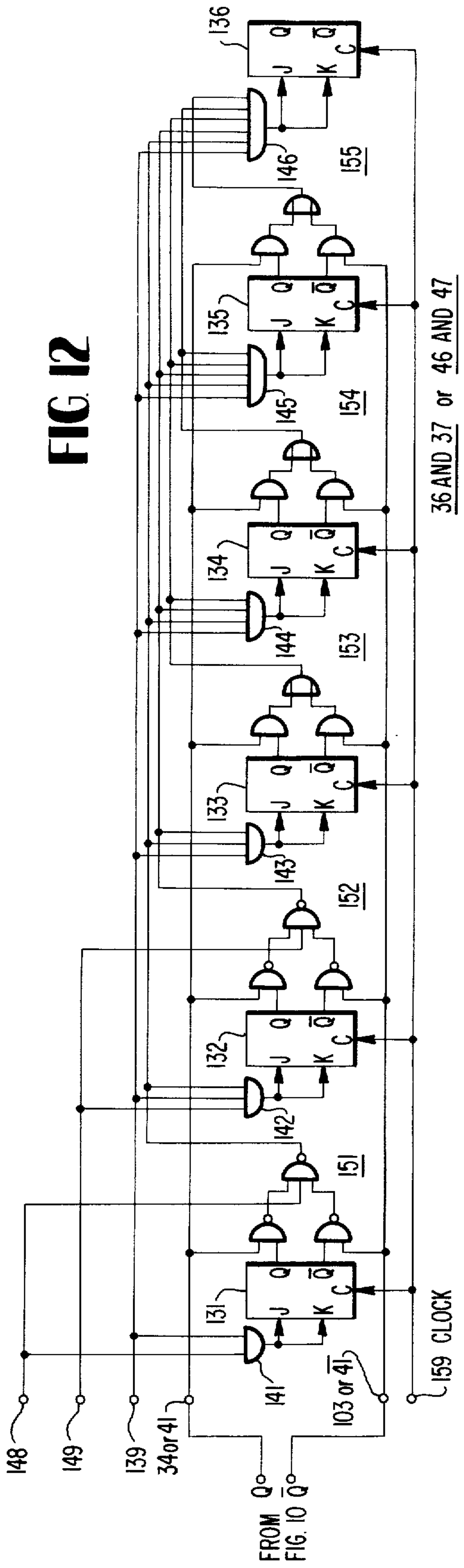
FIG. 12 is a block diagram of a reversible counter which may be used as a combination of the adder and memory used in the embodiments of this invention.

Referring to FIG. 12, an example of the reversible counter for use in various embodiments of this invention as a combination of the memory 36 or 45 and the adder 37 or 47 comprises a first through a sixth J-K flip-flop circuit 131, 132, 133, 134, 135, and 136, an offset minimum step size pulse input terminal 139, a first through a sixth input gate circuit 141, 142, 143, 144, 145, and 146, a medium step size pulse input terminal 148, a maximum step size pulse input terminal 149, a first through a fifth output gate circuit 151, 152, 153, 154, and 155, and a clock pulse input terminal 159. If the offset operation is to be resorted to, the offset minimum, the medium, and the maximum step size pulse input terminals 139, 148, and 149 and the clock pulse input terminal 159 are supplied with the respective signals to be described later in conjunction with an example of the offset circuit 39 depicted in FIG. 14. Otherwise, the offset medium step size pulse input terminal 139 and the associated connections leading to the input gate circuits 141 through 146 may be neglected. Also, the sampling pulses supplied either through the sampling pulse input terminal 32 or from the clock pulse regenerator directly to the clock pulse input terminal 149 and then delayed as shown with a dashed line by a delay that is equal to the delay introduced by the comparator flip-flop circuit 102, by the digital step size generator 35, and by the gates 141 through 146 and 151 through 155 or only by the latter two, are supplied to the C input terminals of the J-K flip-flop circuits 131 through 136 as the clock pulses. The sampling pulses, however, are used without the delay when the reversible counter is used in the above-mentioned modification of the second embodiment in which the instantaneous addition of the analog step size signal is resorted to. Furthermore, the digital step size signal representative of the medium step size 2 or −2 is supplied from the NOR first output terminal 127B of the digital step size signal generator 35 or 45 directly to the medium step size pulse input terminal 148 and thence to the first input gate circuit 141 as an inhibit signal (the NOR output signal of the first OR gate 127 being applied to the first input gate circuit 141) and to the first output gate circuit 151 as an OR input signal. In addition, the digital step size signal representative of the maximum step size 4 or −4 is likewise supplied from the NOR second output terminal 128B directly to the maximum step size pulse input terminal 149 and thence to the second input gate circuit 142 and the second output gate circuit 152. Controlled by the true and the NOT delta modulated digital signals derived either from the comparator 33 at the converter and the comparator output terminals 34 and 103 or from the digital signal input terminal 41 and from an inverter (not shown) for deriving from the input delta modulated digital signal a NOT delta modulated digital signal, respectively, the output gate circuits 151 through 155 select the true or the NOT output signals of the associated J-K flip-flop circuits 131 through 135 to apply the selected signals to the related subsequent-stage J-K flip-flop circuits 132 through 136 through the accompanying input gate circuits 142 through 146, which are operative to carry out the parallel carries and borrows. The result of the addition is accumulated in the first through the sixth J-K flip-flop circuits 131 through 136 and produced from the Q and the $\overline{Q}$ output terminals thereof through output leads (not shown). It will be understood in connection with this example that the maximum and the minimum digital values of the digital signal accumulated in the reversible counter are binary 111111 and 000000, respectively.

Figure 13:
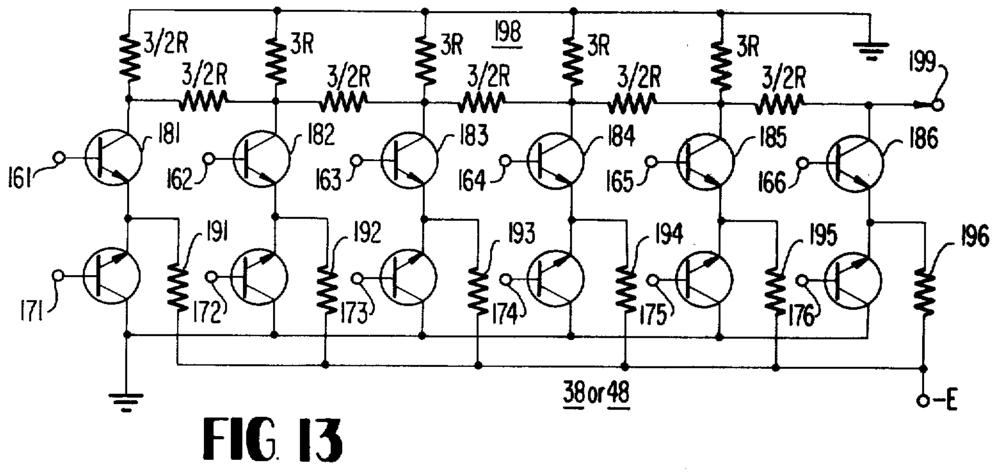
FIG. 13 is a circuit diagram of an example of the local digital-to-analog converters used in the embodiments of this invention.

Referring to FIG. 13, an example of the local digital-to-analog converters 38 and 48 used throughout the embodiments of this invention comprises a first through a sixth pair of input terminals 161–171, 162–172, 163–173, 164–174, 165–175, and 166–176 connected to the Q and the $\overline{Q}$ output terminals of the first through the sixth memory J-K flip-flop circuits 131 through 136, a first through a sixth constant current switching circuit 181, 182, 183, 184, 185, and 186, each including two transistors connected to the associated one of the input terminal pairs 161–171 through 166–176, a first through a sixth resistor 191, 192, 193, 194, 195, and 196 for supplying a common constant potential −E to the transistor emitters of the first through the sixth switching circuits 181 through 186, respectively, a ladder network 198 composed of resistive impedances interconnecting the switching circuits 181 through 186 as shown, and an output terminal 199 connected in the manner illustrated. The six-bit output signal derived from the memory 36 are supplied to the constant current generator formed by the switching circuits 181 through 186 and the resistors 191 through 196, which in turn supplies currents to the ladder network 198 to make the network 198 deliver a corresponding analog signal to the output terminal 199 and thence either directly to the predicted analog signal input terminal of the comparator 33 or to the analog signal output terminal 44.

Figure 14:
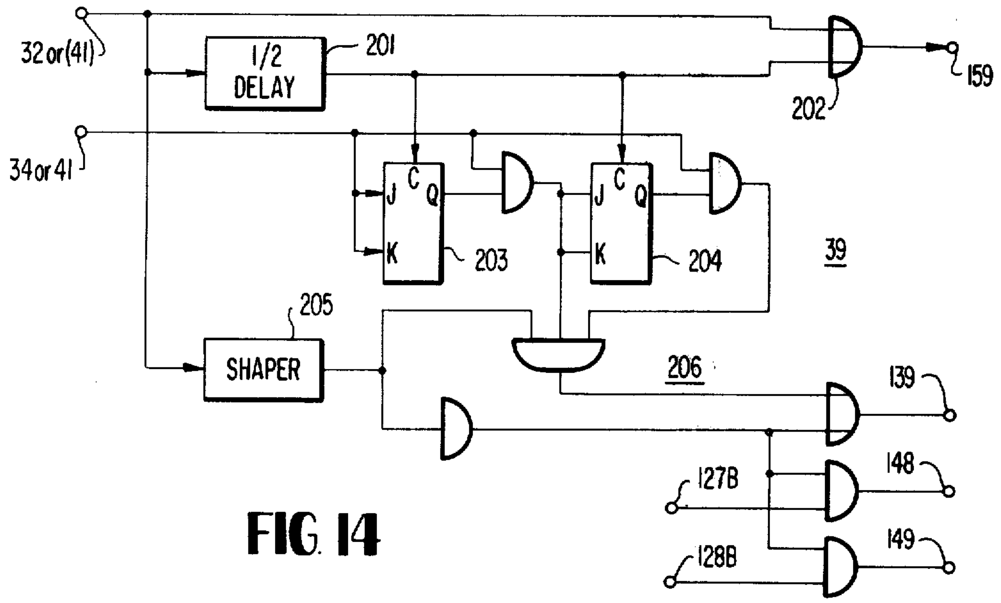
FIG. 14 is a block diagram of an example of the offset circuit used i the modification depicted in FIG. 1.

Referring to FIG. 14, an example of the offset circuit 39 illustrated with reference to FIG. 1 and equally well applicable to any of the second through the fifth embodiments of this invention comprises a delay circuit 201 for delaying the sampling pulses supplied either through the sampling pulse input terminal 32 or from the clock pulse regenerator by a half sampling period, an OR gate 202 for producing frequency doubled sampling pulses to be supplied to the clock pulse input terminal 159 of the reversible counter as the clock pulses, a first and a second J-K flip-flop circuit 203 and 204 responsive to the delayed sampling pulses applied to the C input terminals and to the true delta modulated digital signal supplied either from the converter output terminal 34 or from the digital signal input terminal 41 to the J and the K input terminals and in cooperation with AND gates associated therewith for adding a quarter step size one-fourth to each step size pulse of the positive going minimum step size 1, a wave form shaper 205 for deriving from the sampling pulses a control pulse sequence assuming a logic 1 and a logic 0 level at the former and the latter halves of each sampling period, and a selection gate circuit 206 responsive to the control pulse sequence, the Q output signals of the first and the second J-K flip-flop circuits 203 and 204, and the NOR digital step size pulses of the medium and the maximum step sizes for supplying the offset minimum step size pulse input terminal 139 with an offset minimum step size pulses and for supplying the medium and the maximum step size pulse input terminals 148 and 149 with a pair of logic 1 pulses representative of the medium and the maximum step sizes, respectively, at the former half of each sampling period and a pair of logic 0 pulses at the latter half of each sampling period. It should be noted that a like wave form shaper 205 for time dividing each sampling period makes it possible to use a plurality of step sizes other than $2^n$ where $n$ is a positive integer, such as 1, 2, and 4 illustrated above.

Figure 15:
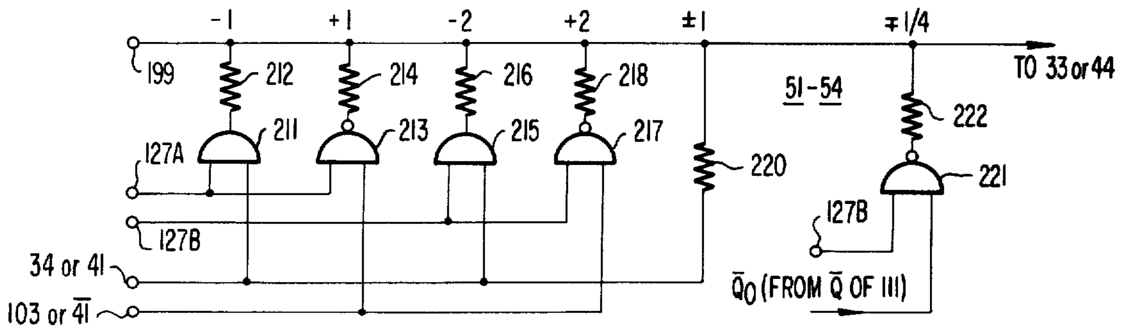
FIG. 15 is a circuit diagram of an example of the analog summation loop used in the modification depicted in FIG. 4.

Referring to FIG. 15, an analog summation loop for use in the modification of the second embodiment of this invention in adding both the instantaneous and the delayed analog step size signals comprises a first AND gate 211 supplied with the true medium step size pulses from the first OR gate 127 of the digital step size signal generator 35 or 45 and with the true delta modulated digital signal either from the converter output terminal 34 or from the digital signal input terminal 41 for adding through an associated resistor 212 of the weight one-half a signal representative of the negative going minimum step size −1 to the local analog signal led through the output terminal 199 of the local digital-to-analog converter 38 or 48 when the generator 35 or 45 produces a digital step size pulse representative of the negative going medium step size −2 and also of the maximum step size −4, a first NAND gate 213 supplied with the true medium step size pulses and with the NOT delta modulated digital signal either through the comparator output terminal 103 or from the inverter for adding through an associated resistor 214 of the weight one-half a signal representative of the positive going minimum step size 1 to the local analog signal when the generator 35 or 45 produces a digital step size pulse representative of the positive going medium step size 2 and also the positive going maximum step size 4, a second AND gate 215 and an associated resistor 216 of the weight 1 connected in the like manner as shown so as to add a signal representative of the negative going medium step size −2 to the local analog signal when the generator 35 or 45 produces a digital step size pulse representative of the negative going maximum step size −4, a second NAND gate 217 and an associated resistor 218 of the weight 1 connected as shown so as to add a signal representative of the positive going medium step size 2 to the local analog signal when the generator 35 or 45 produces a digital step size pulse representative of the positive going maximum step size 4, and a mere resistor 220 of the weight one-half for supplying therethrough the true delta modulated digital signal to add a signal representative of the negative and the positive going minimum step sizes −1 and 1 to the local analog signal when the generator 35 or 45 produces a digital step size signal representative of the negative and the positive going minimum, medium, or maximum step sizes −1, −2, or −4 and 1, 2, or 4, respectively. In this manner, the gates and the resistors instantaneously add an analog step size signal of the analog values ±4, ±2, and ±1 to the local analog signal when the digital step size signal is representative of the step sizes ±4, ±2, and ±1, respectively. The loop further comprises a third NAND gate 221 supplied with the NOR output signal of the first OR gate 127 of the digital step size generator 35 or 45 and the $\overline{Q}$ output signal of the first flip-flop circuit 111 thereof for adding through an associated resistor 222 of the weight 2 a signal representative of one-fourth and −one-fourth to the local analog signal when the generator 35 or 45 produces a digital step size pulse representative of the positive and the negative going minimum step sizes 1 and −1 and the first generator flip-flop circuit 111 produces from the $\overline{Q}$ output terminal a logic 1 and a logic 0 level, respectively. The output signal of the loop is supplied to the predicted analog signal input terminal of the comparator 33 or to the analog signal output terminal 44.

Figure 16:
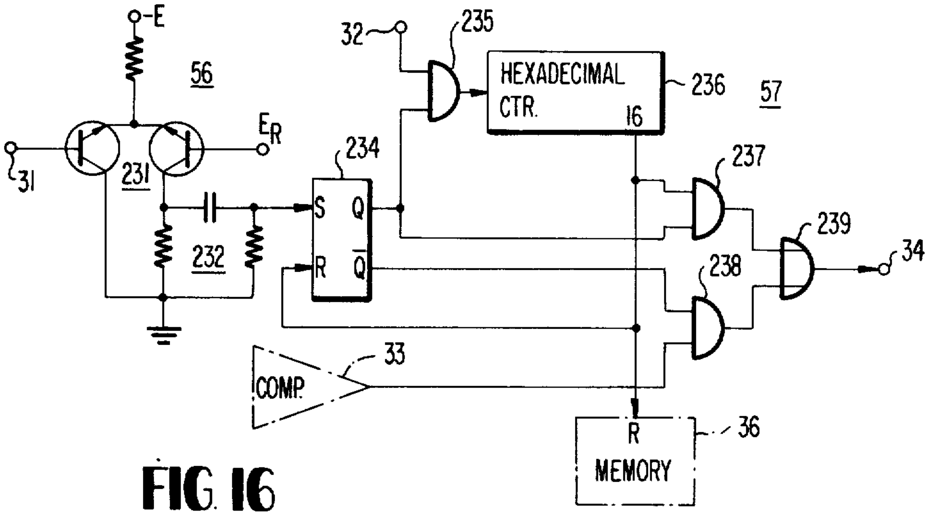
FIG. 16 illustrates an example of the reset code generator used in the analog-to-digital converters according to the third embodiment of this invention.

Referring to FIG. 16, an example of the reset code generator, namely, a combination of the horizontal synchronizing signal detector 56 and the reset code substitution circuit 57 used in the third embodiment of this invention comprises a level detector 231 responsive to the picture signal supplied through the analog signal input terminal 31 and a reference potential $E_R$ for producing an output signal when the horizontal synchronizing signal appear, a differentiating circuit 232 for producing a pulse at each building up of the output signal of the level detector 231, a set-reset flip-flop circuit 234 set by the pulse supplied thereto from the differentiating circuit 232, an AND gate 235 enabled by the Q output signal of the flip-flop circuit 234 for causing the sampling pulses supplied thereto through the sampling pulse input terminal 32 to pass therethrough, a hexadecimal counter 236 stepped by the sampling pulses supplied from the AND gate 235 for producing a logic 1 pulse of the one sampling period duration that builds up fifteen sampling periods after the flip-flop circuit 234 is set and for thereby resetting the flip-flop circuit 234 and the memory 36, a first output AND gate 237 enabled by the Q output signal of the flip-flop circuit 234 assuming the logic 1 value for a duration of 16 sampling periods for causing the output pulse of the hexadecimal counter 236 to pass therethrough, a second output AND gate 238 enabled by the $\overline{Q}$ output signal of the flip-flop circuit 234 for causing the delta modulated digital signal supplied from the comparator 33 to pass therethrough, and an output OR gate 239 for supplying the delta modulated digital signal interspersed with a reset code composed of fifteen logic 0 periods followed by one logic 1 period at each horizontal synchronizing period to the comparator output terminal 34. As will readily be understood, it is assumed here that a horizontal synchronizing period is equal to sixteen sampling periods or longer.

Figure 17:
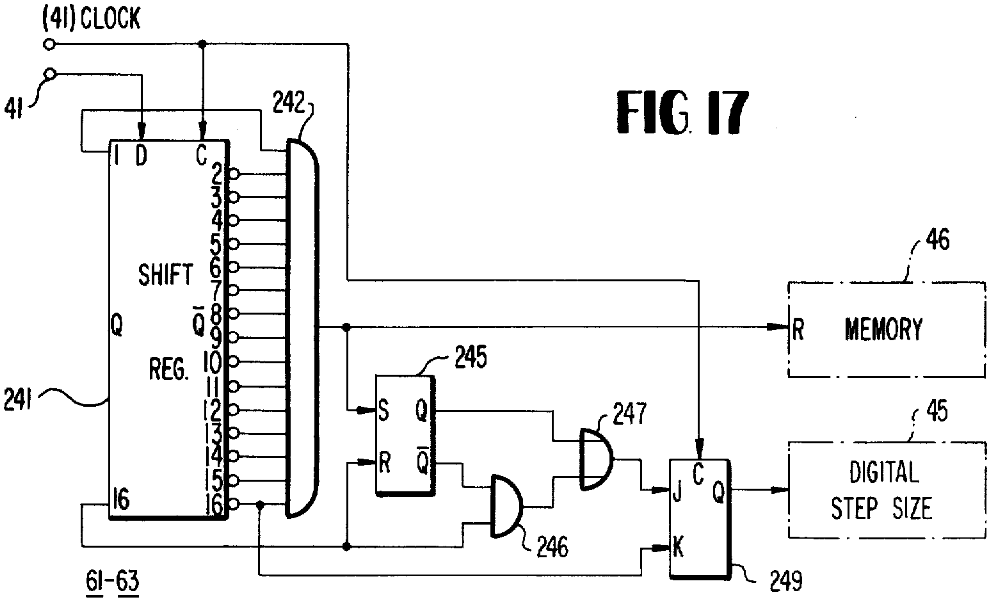
FIG. 17 is a block diagram of an example of the reset code detector and the related circuits used in the digital-to-analog converters according to the third embodiment of this invention.

Referring to FIG. 17, an example of the reset code detector 61 used in the digital-to-analog converter according to the third embodiment and the associated delay circuit 62 and the stationary signal substitution circuit 63 comprises a 16-stage shift register 241 supplied at the C input terminal with clock pulses from the clock pulse regenerator for producing a true output signal of the first stage, NOT output signals of the second through the 16th stages, and a true output signal of the 16th stage, a 16-input AND gate 242 supplied with the true output pulses of the first stage and the NOT output pulses of the second through the 16th stages for producing a pulse each time a reset code is registered in the register 241 to reset the memory 46, a set-reset flip-flop circuit 245 set and reset when the logic 1 pulse of a reset code reaches the first stage and this logic 1 pulse reaches the sixteenth stage, respectively, a two-input AND gate 246 supplied with that true output signal of the sixteenth stage which is the delta modulated digital signal delayed by a reset code duration and with that $\overline{Q}$ output signal of the flip-flop circuit 245 which is logic 1 while the logic 1 pulse of a reset code is not present in the shift register 241 for causing the delayed delta modulated digital signal to pass therethrough, an OR gate 247 supplied with the pulses produced by the two-input AND gate 246 and with that Q output signal of the flip-flop circuit 245 for 16 sampling periods from the time the logic 1 pulse of a reset code reaches the first stage for producing logic 1 pulses a reset code duration after the logic 1 pulses of the delta modulated digital signal reach the digital signal input terminal 41, and a J-K flip-flop circuit 249 supplied with the clock pulses at the C input terminal, with the output pulses of the OR gate 247 at the J input terminal, and with the NOT output pulses of the sixteenth stage at the K input terminal for substituting a 16-bit stationary signal code 101010 . . . 10 for each of the reset codes in the delayed delta modulated digital signal to supply the so-substituted digital signal to the digital step size signal generator 45.

Figure 18:
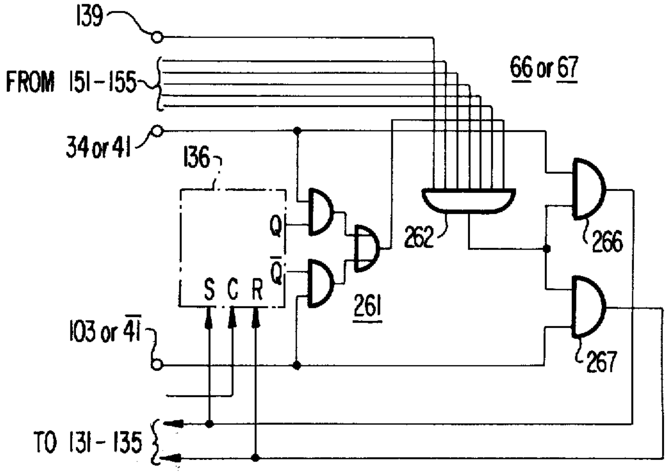
FIG. 18 is a block diagram of an example of the digital limiter or clamper to be used together with the reversible counter depicted in FIG. 12 in the fourth embodiment of this invention.

Referring to FIG. 18, an example of the digital limiters 66 and 67 used in the fourth embodiments of this invention together with the reversible counters illustrated with reference to FIG. 12 comprises a sixth output stage circuit 261 connected to the sixth J-K flip-flop circuit 136 of the reversible counter and either to the converter and the comparator output terminals 34 and 103 or to the digital signal input terminal 41 and the inverter in a manner similar to each of the third through the fifth output gate circuits 153 through 155, a 7th bit AND circuit 262 responsive to the output signals of the first through the sixth output gate circuits 151 through 155 and 261 for producing a seventh bit carry and borrow signal, a set AND gate 266 responsive to the seventh bit carry and borrow signal and the true delta modulated digital signal for producing a set pulse to be applied to the set input terminals S of the first through the sixth J-K flip-flop circuits 131 through 136 to provide the memory 36 or 46 with a memorized digital signal representative of the binary 111111 each time the sum of the digital step size signal and the previous sampling point memorized digital signal exceeds the maximum capacity, and a reset AND gate 267 responsive to the seventh bit carry and borrow signal and the NOT delta modulated digital signal for producing a reset pulse to be applied to the reset input terminals R of the first through the sixth flip-flop circuits 131 through 136 to provide the memory 36 or 46 with a memorized digital signal representative of the binary 000000 each time the algebraic sum of the digital step size signal and the previous memorized or accumulated digital signal descends beyond the minimum capacity. It should be pointed out in connection with this example that it is unnecessary to limit the digital sum signal to be accumulated in the memory 36 or 46 in consideration of the digital step size signal to be added to the accumulated digital signal at the next subsequent sampling point.

Figure 19:
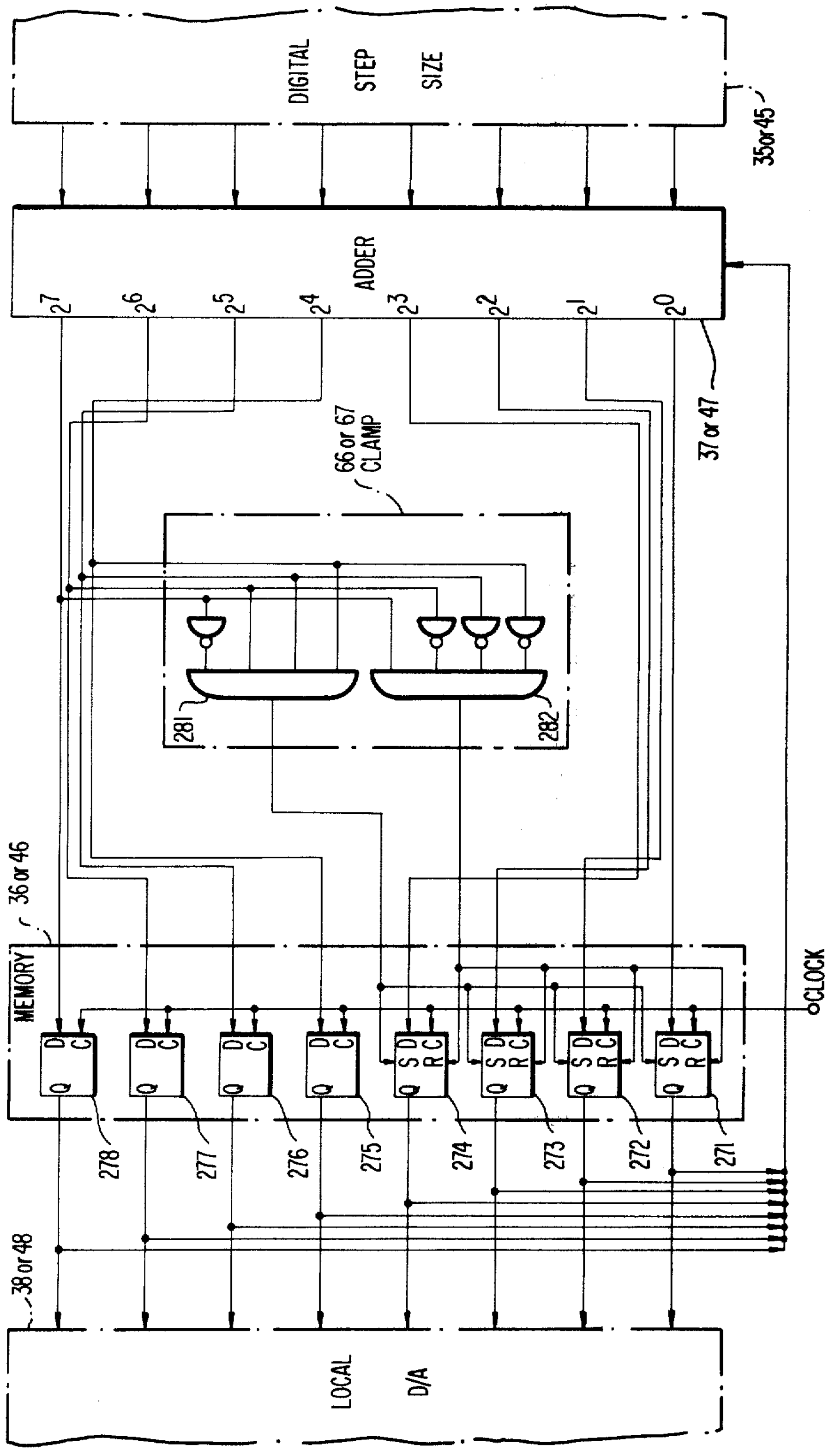
FIG. 19 is a block diagram of an example of the digital clamper to be used in the fourth embodiment of this invention together with the separate memory and adder.

Referring to FIG. 19, an example of the digital limiters 66 and 67 for use in the fourth embodiment of this invention together with an 8-bit memory 36 or 46 and an 8-bit parallel digital adder 37 or 47 is responsive to the more significant four bits of the 8-bit parallel digital pulses of the new digital sum signal to change the less significant four bits of the accumulated digital signal to logic 0 and 1 values when the new digital step size signal becomes equal to binary 01110000 representative of decimal ±112 or more and to binary 10001111 representative of decimal −113 or less. The memory 36 or 46 comprises a first bit (least significant digit) through an eighth bit (representative of sign) flip-flop circuits 271, 272, 273, 274, 275, 276, 277, and 278 responsive to the sampling pulses supplied to the C input terminals for storing the first through the eighth bit digital pulses of the new digital sum signal supplied to the D input terminals, respectively. The adder 37 or 47 is responsive to the digital step size signal and the accumulated digital signal to produce the new digital sum signal. The limiter 66 or 67 comprises a first AND gate 281 responsive to the true fifth through seventh bit digital pulses of the new digital sum signal and the NOT eighth bit pulse thereof for producing a reset pulse to be applied to the reset signal input terminals R of the first through the fourth flip-flop circuits 271 through 274 to change the contents thereof to logic 0 values each time the new digital sum signal becomes representative of a binary value of 0111XXXX where an X represents logic 1 or 0. The limiter 66 or 67 further comprises a second AND gate 282 responsive to the NOT fifth through seventh bit digital sum pulses and the true eighth bit digital sum pulse of the new digital sum signal for producing a set pulse to be applied to the set signal input terminals S of the first through the fourth flip-flop circuits 271 through 274 to change the contents thereof to logic 1 values each time the new digital sum signal becomes representative of a binary value of 1000XXXX.

Figure 20:
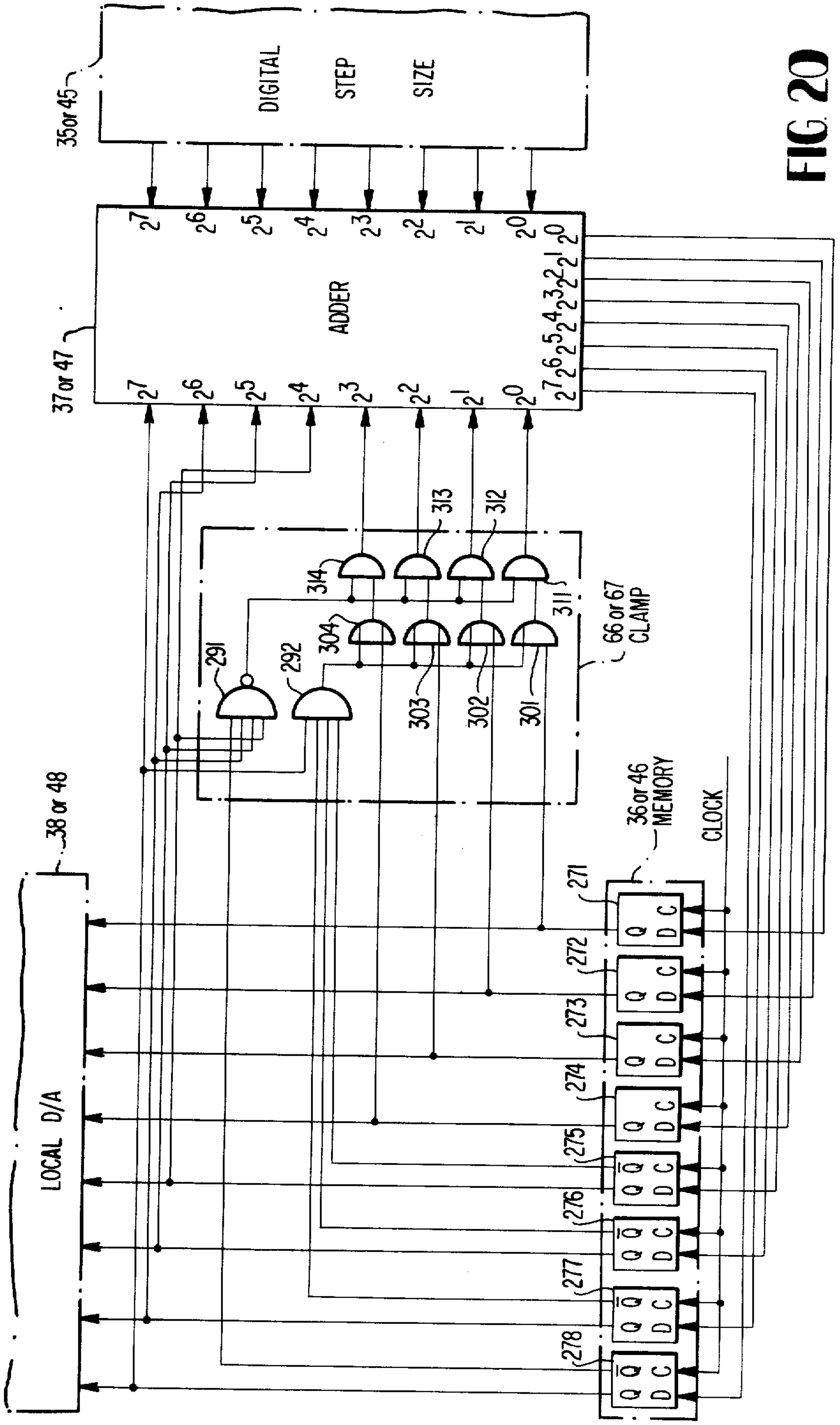
FIG. 20 is a block diagram of an example of the digital clampers for use in the converters depicted in FIG. 9 together with the individual memory and adder.

Referring finally to FIG. 20, an example of the digital limiters 66 and 67 used in the fifth embodiments of this invention together with an 8-bit memory 36 or 46 and an 8-bit parallel digital adder 37 or 47, both of similar construction as those shown in FIG. 19, comprises a NAND gate 291 responsive to the true fifth through 7th bit memorized digital signal and the NOT 8th bit memorized digital signal for producing a logic 1 maximum level pulse unless the accumulated digital signal is representative of a binary number 0111XXXX and otherwise a logic 0 signal, a fourinput AND gate 292 responsive to the NOT fifth through seventh bit accumulated digital signal and the true 8-th bit accumulated digital signal for producing a logic 1 minimum level pulse when the accumulated digital signal is representative of a binary number 1000XXXX and otherwise a logic 0 signal, a first through a fourth OR gate 301, 302, 303, and 304 for letting the logic 1 minimum level pulse pass therethrough on the one hand and the first through the fourth bit accumulated digital signal pulses pass therethrough, respectively, on the other hand, and a first through a fourth AND gate 311, 312, 313, and 314 enabled by the logic 1 maximum level pulse for allowing the logic 1 output pulses of the OR gates 301 through 304 to pass therethrough to the adder 37 or 47 as the first through the fourth bit digital pulses of the level limited accumulated digital signal.

Incidentally, it will now be understood in connection with FIGS. 19 and 20 that the positive and the negative maximum step sizes are assumed to be −112 and −113, respectively.

What is claimed is:

1. A converter for carrying out conversion between a digital signal of a certain type and a predicted analog signal, said digital signal consisting of a sequence of one-bit pulses each having a value dependent upon a comparison at a sample period of a self-correlated analog signal and said predicted analog signal, said converter comprising, a. digital step size generator means responsive to each said one bit pulse and a number of immediately preceding one bit pulses for generating a digital step size signal representing one of at least three predetermined step sizes, the particular digital step size signal generated being dependent upon the pattern of said one bit pulses, b. a delay circuit for delaying said digital step size signal by one sampling period, c. means for deriving from the delayed digital step size signal a local digital signal, d. an analog step size signal generator responsive to said local digital signal for generating an analog step size signal, e. accumulator means responsive to said digital step size signals for accummulating a digital representation of the sum of the step sizes represented by said digital step size signal, f. a local digital-to-analog converter for converting said accumulated digital representation into a local analog signal, and g. an analog adder for deriving an analog algebraic sum of said local analog signal and said analog step size signal, said analog algebraic sum corresponding to said predicted analog signal.

2. A converter as claimed in claim 1 wherein said digital step size generator comprises, a. means responsive to first and second patterns of said last received consecutive one-bit pulses for generating a first digital step size signal representing a first predetermined step size, said first pattern comprising four consecutive 1-bit pulses of the same bit value, said second pattern comprising three consecutive 1-bit pulses, including the last received 1-bit pulse, of a first bit value, and four preceding consecutive 1-bit pulses of a second bit value, b. means responsive to third, fourth and fifth patterns of said last received consecutive 1-bit pulses for generating a second digital step size signal representing a second predetermined step size, said third pattern comprising three consecutive 1-bit pulses, including said last received 1-bit pulse, of a first bit value preceded by not more than three consecutive one-bit pulses of a second bit value, said fourth pattern comprising two consecutive 1-bit pulses, including said last received 1-bit pulse, of a first value preceded by four consecutive 1-bit pulses of a second bit value, and said fifth pattern comprising four consecutive bit pulses of a first bit value preceding a last received bit pulse of a second bit value, and c. means responsive to the absence of all of said first through fifth patterns for producing a third digital step size signal representing a third predetermined step size, the ratio of said first to said second to said third predetermined step sizes being 4 : 2 : 1.

3. A converter as claimed in claim 1, wherein:

said at least three step sizes are $\pm 2^i$ times a unit step size where $i$ is one of consecutive integers 0, 1, . . . , and $n$, $n$ being at least two, and said digital step size generator means comprises means for offsetting a preselected one of two step sizes ± (said unit step size) by an amount given by $1/(2^m)$ of said unit step size where $m$ is a predetermined positive integer.

4. A converter as claimed in claim 1, wherein said means for deriving said local digital signal comprises, means for deriving a second digital albegraic sum of said digital step size signal and said delayed digital step size signal to produce said local digital signal.

5. A converter as claimed in claim 1 wherein said self-correlated analog signal substantially periodically assumes a combination of predetermined analog values, said converter further comprising:

a predetermined analog value detector responsive to said self-correlated analog signal for producing a detection signal each time said self-correlated analog signal assumes said combination of said predetermined analog values, means responsive to said detection signal for resetting said accumulator means to accumulate therein a prescribed digital value, and a specific code substitution circuit responsive to said detection signal for substituting a specific code into said digital signal in place of the sequence of one-bit pulses which would otherwise occur in said digital signal, said specific code being selected so as never to appear in said one-bit pulse train unless the substitution is carried out.

6. A converter as claimed in claim 1 wherein said self-correlated analog signal substantially periodically assumes a combination of predetermined analog values, and said one-bit pulse train assumes a combination of predetermined digital values in correspondence to said self-correlated analog signal asssuming each combination of said predetermined analog values, said converter further comprising:

a predetermined digital value detector responsive to said one-bit pulse train for producing a detection signal each time said one-bit pulse train assumes the combination of said predetermined digital values, means responsive to said detection signal for resetting said accumulator means to accumulate therein a prescribed digital value, and a specific code substitution circuit responsive to said detection signal for substituting a specific code for each combination of said predetermined digital values, said specific code being representative of the arithmetic means of each combination of said predetermined analog values.

7. A converter as claimed in claim 1, wherein said accumulator means comprises means for limiting said accumulated digital signal below a predetermined digital signal level, and means for memorizing said accumulated digital signal.

8. A converter as claimed in claim 1 wherein said accumulator means comprises, a digital storage means adapted to store digital values up to a fixed maximum, digital adder means responsive to said digital step size signals and to the value stored in said storage means for providing a digital algebraic sum, and digital clamping means responsive to said digital algebraic sum for providing at its output thereof said digital algebraic sum limited to a maximum value less than said fixed maximum, said last mentioned output being applied to said storage means as said accumulated digital representation.

9. A converter as claimed in claim 1 wherein said accumulator means comprises a digital storage means adapted to store digital values up to a fixed maximum, digital clamping means responsive to said stored value for providing at its output thereof said stored digital value limited to a maximum value which is more than the maximum digital step size below said fixed maximum of said storage means, and digital adder means for adding the said digital step size signals to said limited stored digital values to produce an accumulated sum which is entered into said digital storage means.

* * * * *

UNITED STATES PATENT AND TRADEMARK OFFICE
CERTIFICATE OF CORRECTION

PATENT NO. : 3,908,181

DATED : September 23, 1975

INVENTOR(S) : Seiichiro Shigaki, Hiroshi Iijima, Haruo Kaneko

It is certified that error appears in the above-identified patent and that said Letters Patent are hereby corrected as shown below:

Column 3, line 66 - delete "it" and insert --It--
Column 6, line 5 - delete "supplies" and insert --supplied--
Column 8, line 44 - delete "tho" and insert --to--
line 54 - delete "abgebraic" and insert --algebraic--
Column 11, line 45 - delete "clampler" and insert --clamper--
Column 12, line 33 - delete "anlog" and insert --analog--
Column 13, line 60 - delete "gerenators" and insert --generators--
Column 15, line 66 - "pulses" should be --pulse--
Column 18, line 64 - delete "±112" and insert --+112--
Column 19, line 35 - delete "fourinput" and insert --four-input--
line 55 - delete "-112" and insert --+112--

Signed and Sealed this

Third Day of August 1976

[SEAL]

*Attest:*

RUTH C. MASON
*Attesting Officer*

C. MARSHALL DANN
*Commissioner of Patents and Trademarks*